US011404956B2

(12) United States Patent
Joo et al.

(10) Patent No.: US 11,404,956 B2
(45) Date of Patent: Aug. 2, 2022

(54) POWER CONVERSION APPARATUS AND AC-DC CONVERSION APPARATUS

(71) Applicant: SAMSUNG ELECTRONICS CO., LTD., Suwon-si (KR)

(72) Inventors: Sungyong Joo, Suwon-si (KR); Jeongil Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 232 days.

(21) Appl. No.: 16/956,295

(22) PCT Filed: Jan. 25, 2019

(86) PCT No.: PCT/KR2019/001066
§ 371 (c)(1),
(2) Date: Jun. 19, 2020

(87) PCT Pub. No.: WO2019/156401
PCT Pub. Date: Aug. 15, 2019

(65) Prior Publication Data
US 2020/0321854 A1 Oct. 8, 2020

(30) Foreign Application Priority Data
Feb. 7, 2018 (KR) .......................... 10-2018-0015252

(51) Int. Cl.
*H02M 1/42* (2007.01)
*H02M 3/335* (2006.01)
*H03K 5/24* (2006.01)
(52) U.S. Cl.
CPC ..... *H02M 1/4208* (2013.01); *H02M 3/33569* (2013.01); *H03K 5/24* (2013.01)
(58) Field of Classification Search
CPC .................. H02M 1/4208; H02M 3/33569
See application file for complete search history.

(56) References Cited

U.S. PATENT DOCUMENTS 4,437,146 A 3/1984 Carpenter
5,568,041 A * 10/1996 Hesterman ............ H02M 1/425
363/37
(Continued)

FOREIGN PATENT DOCUMENTS

JP 2001-190073 A 7/2001
JP 2010-104218 A 5/2010
(Continued)

OTHER PUBLICATIONS

International Search Report dated Jul. 2, 2018 in corresponding International Application No. PCT/KR2019/001066.

*Primary Examiner* — Rafael O De Leon Domenech
(74) *Attorney, Agent, or Firm* — Staas & Halsey LLP

(57) ABSTRACT

A power conversion device which includes an input terminal that receives a rectified AC power, an active power factor correction circuit including a switching element that turns on or off and boosts an input voltage to correspond to a turn on time, an output terminal connected to an output of the active power factor correction circuit. The power conversion device includes a comparator that compares an output voltage of the output terminal with a reference voltage and outputs a signal having a different magnitude depending on the comparison result, a control circuit that adjusts a duty cycle of the control signal depending on an output signal of the comparator, and a discharge circuit electrically connected between the input terminal and an output of the comparator, and when the input voltage is equal to or greater than a first specified voltage, that discharges the output of the comparator.

15 Claims, 7 Drawing Sheets

(56) References Cited

U.S. PATENT DOCUMENTS

| | | | |
|---|---|---|---|
| 6,191,564 B1 | 2/2001 | Mao | |
| 6,222,746 B1 * | 4/2001 | Kim | H02M 1/4225 |
| | | | 363/80 |
| 6,259,613 B1 * | 7/2001 | Lee | H02M 1/4225 |
| | | | 323/284 |
| 7,489,532 B2 | 2/2009 | Shih | |
| 7,772,782 B2 | 8/2010 | Chu et al. | |
| 8,089,255 B2 | 1/2012 | Chen | |
| 8,379,423 B2 | 2/2013 | Park et al. | |
| 8,400,090 B2 | 3/2013 | Marcinkiewicz et al. | |
| 8,824,181 B2 | 9/2014 | Choi et al. | |
| 8,855,474 B2 | 10/2014 | Marcinkiewicz et al. | |
| 2002/0140407 A1 * | 10/2002 | Hwang | H02M 1/4225 |
| | | | 323/207 |
| 2002/0196644 A1 * | 12/2002 | Hwang | H02M 1/36 |
| | | | 363/89 |
| 2003/0020442 A1 * | 1/2003 | Hwang | H02M 1/32 |
| | | | 323/288 |
| 2011/0006748 A1 * | 1/2011 | Jang | H02M 1/4225 |
| | | | 323/299 |
| 2014/0340949 A1 * | 11/2014 | Chen | H02M 1/4225 |
| | | | 363/44 |
| 2014/0354186 A1 * | 12/2014 | Sun | H05B 45/395 |
| | | | 315/310 |
| 2017/0222565 A1 * | 8/2017 | Sonobe | H02M 3/33546 |
| 2018/0026523 A1 * | 1/2018 | Nate | H05B 45/10 |
| | | | 318/504 |
| 2020/0008277 A1 * | 1/2020 | Zeigler | H05B 45/385 |

FOREIGN PATENT DOCUMENTS

| | | |
|---|---|---|
| JP | 10-2011-0046926 A | 5/2011 |
| JP | 2014-27844 A | 2/2014 |

* cited by examiner

POWER CONVERSION APPARATUS AND AC-DC CONVERSION APPARATUS

CROSS-REFERENCE TO RELATED APPLICATIONS

This application is a U.S. National Stage Application which claims the benefit under 35 U.S.C. § 371 of International Patent Application No. PCT/KR2019/001066 filed on Jan. 25, 2019, which claims foreign priority benefit under 35 U.S.C. § 119 of Korean Patent Application No. 10-2018-0015252 filed on Feb. 7, 2018 in the Korean Intellectual Property Office, the contents of both of which are incorporated herein by reference.

TECHNICAL FIELD

Embodiments disclosed in the disclosure relate to an AC power conversion technology.

BACKGROUND ART

In general, an AC-DC conversion device may include a power factor correction circuit for increasing a consumption efficiency of an input power. A high-capacity electrolytic condenser for removing ripples is used at an output of the power factor correction circuit. In the case of the electrolytic condenser, there is a risk of explosion due to an electrolytic solution inside. An active power factor correction circuit among the power factor correction circuits may use a capacity of the electrolytic condenser having a larger capacity, in a case that an output magnitude suddenly increases due to a sudden change in the input power, for example, due to a power imbalance. In this case, the risk of explosion of the electrolytic condenser may be greater.

DISCLOSURE

Technical Problem

Various embodiments disclosed in the disclosure provide a power conversion device and an AC-DC conversion device capable of reducing a risk of explosion of an active power factor correction circuit.

Technical Solution

A power conversion device according to various embodiments disclosed in the disclosure includes an input terminal that receives a rectified AC power, an active power factor correction circuit that boosts an input power through the input terminal and corrections a power factor, the active power factor correction circuit including a switching element that turns on or off in response to a control signal and boosts an input voltage among the input power to correspond to a turn on time, an output terminal connected to an output of the active power factor correction circuit, a comparator that compares an output voltage of the output terminal with a reference voltage and outputs a signal having a different magnitude depending on the comparison result, a control circuit that adjusts a duty cycle of the control signal depending on an output signal of the comparator, and a discharge circuit electrically connected between the input terminal and an output of the comparator, and when the input voltage is equal to or greater than a first specified voltage, that discharges the output of the comparator.

In addition, an AC-DC conversion device according to an embodiment disclosed in the disclosure includes a rectifying device that rectifies an AC power, and a power conversion device that receives the rectified AC power and outputs a power as a result of power factor correction and boosting, wherein the power conversion device includes an input terminal that receives the rectified AC power, an active power factor correction circuit that boosts an input power through the input terminal and corrections a power factor, the active power factor correction circuit including a switching element that turns on or off in response to a control signal and boosts an input voltage among the input power to correspond to a turn on time, an output terminal connected to an output of the active power factor correction circuit, a comparator that compares an output voltage of the output terminal with a reference voltage and outputs a signal having a different magnitude depending on the comparison result, a control circuit that adjusts a duty cycle of the control signal depending on an output signal of the comparator, and a discharge circuit electrically connected between the input terminal and an output of the comparator, and when the input voltage is equal to or greater than a first specified voltage, that discharges the output of the comparator.

Advantageous Effects

According to the embodiments disclosed in the disclosure, it is possible to reduce a risk of explosion of an active power factor correction circuit. In addition, various effects that can be directly or indirectly identified through the disclosure may be provided.

DESCRIPTION OF DRAWINGS

In connection with the description of the drawings, the same or similar reference numerals may be used for the same or similar components.

MODE FOR INVENTION

Hereinafter, various embodiments of the disclosure will be described with reference to the accompanying drawings. However, this is not intended to limit the disclosure to specific embodiments, and it should be understood that various modifications, equivalents, and/or alternatives of embodiments of the disclosure are included.

Figure 1:
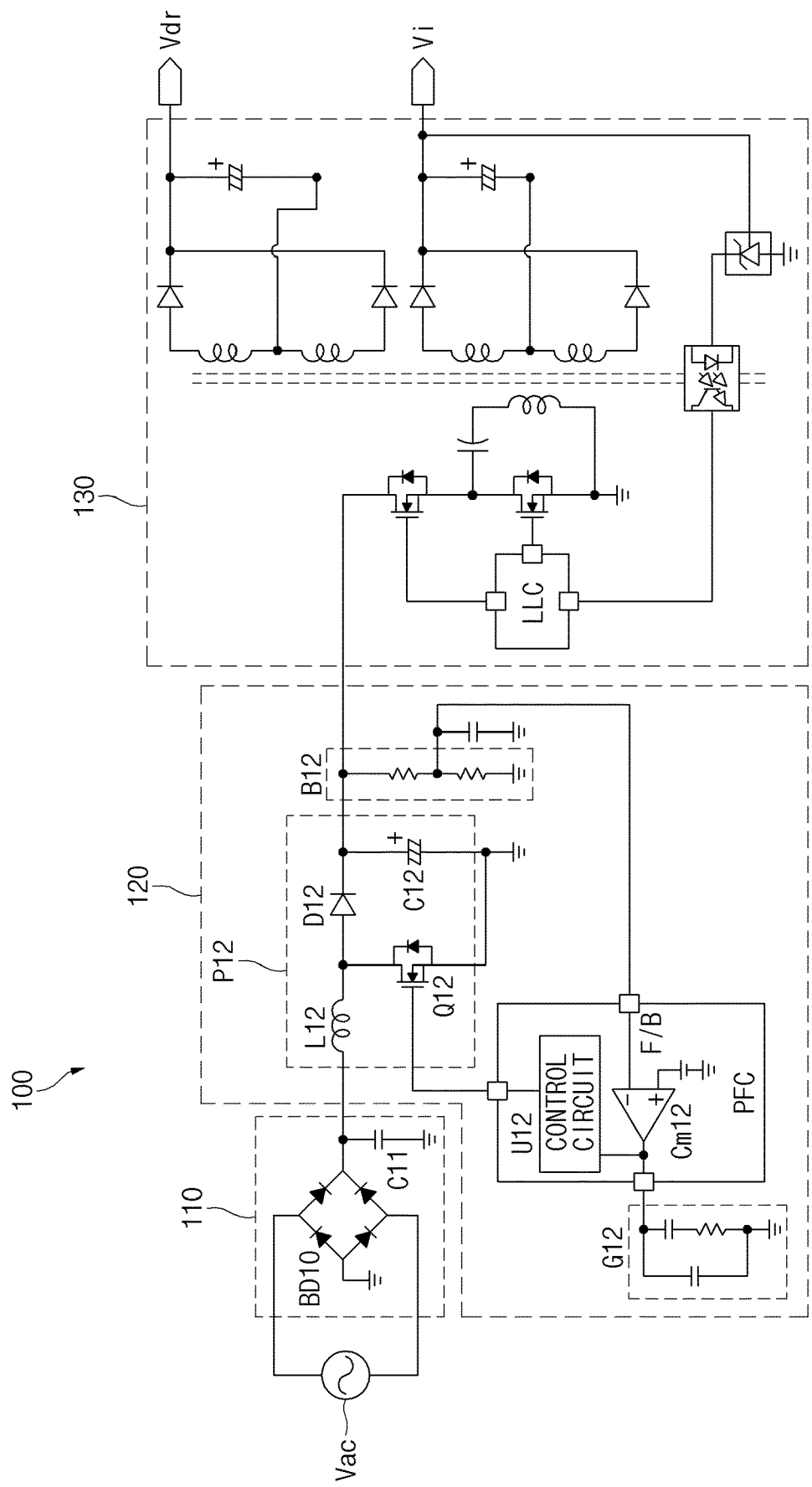
FIG. 1 illustrates a circuit of an AC-DC conversion device according to an embodiment of the disclosure.

FIG. 1 illustrates a circuit of an AC-DC conversion device according to an embodiment of the disclosure.

Referring to FIG. 1, according to an embodiment, an AC-DC conversion device 100 may include a rectifying device 110, a first conversion device 120, and a second conversion device 130. A load circuit (not shown) may be connected to an output terminal of the AC-DC conversion device 100.

According to an embodiment, the rectifying device 110 may receive an AC power and may output a rectified AC power. The rectifying device 110 may include a rectifying circuit, such as a bridge rectifying circuit, that performs a full-wave rectification of the input AC power. An input AC voltage may be a voltage belonging to a range of 90V to 264V. In a power imbalanced area, the AC voltage may change rapidly.

The rectifying device 110 may further includes a smoothing circuit C11, the smoothing circuit C11 may smooth the full-wave rectified AC power. The smoothing circuit C11 is not included in the rectifying device 110, but may be included in the first conversion device 120.

The first conversion device 120 may receive an output of the rectifying device 110, may boost the input voltage, and may correct a power factor. For example, the first conversion device 120 may boost the received power such that a magnitude of the output voltage of the first conversion device 120 is within a specified voltage range (e.g., 390V≤395V≤400V). The first conversion device 120 may include, for example, an active power factor correction circuit P12 of at least one of a continuous conduction mode (CCM), a critical conduction mode (CRM), and an interleaved CRM. The first conversion device 120 may further include a control circuit U12 for controlling a duty cycle of the active power factor correction circuit P12 and a feedback circuit B12 and Cm12 for monitoring an output of the active power factor circuit P12.

The active power factor correction circuit P12 may include an inductor L12, a condenser C12, a diode D12, and a switching element Q12. The active power factor correction circuit P12 may boost the input power to correspond to a duty cycle and may correct the power factor of the input power. The inductor L12 may store an input current at a turn-on time of the switching element Q12, and may output a current stored at an off-time of the switching element Q12. The condenser C12 may smooth an output power of the inductor L12. The diode D12 may allow a current from the inductor L12 to the condenser C12, and may block a current from the condenser C12 to the inductor L12. The switching element Q12 is connected between the inductor L12 and the diode D12, and may be turned on or off in response to a control signal. When the switching element Q12 is turned on, an output terminal of the inductor L12 may be connected to a ground. The switching element Q12 may be, for example, an N-channel FET.

The feedback circuit B12 and Cm12 may include the dividing circuit B12 and the comparator Cm12. The dividing circuit B12 is connected to the output of the active power factor correction circuit P12 to divide a voltage of the active power factor correction circuit P12. The divided voltage may fall within an input voltage range of the comparator Cm12. The input voltage range may be, for example, a voltage range detectable by the comparator Cm12. When the comparator Cm12 receives the voltage divided by the dividing circuit B12, the comparator Cm12 may compare the divided voltage with a reference voltage (e.g., 2.5V or 1.5V), and may output a signal having a different magnitude depending on the comparison result. For example, when the divided voltage is less than the reference voltage, the comparator Cm12 may output a first signal, and when the divided voltage is greater than or equal to the reference voltage, the comparator Cm12 may output a second signal (<first signal). A gain adjustment circuit G12 may be connected to an output of the comparator Cm12. For another example, the comparator Cm12 may output a difference voltage between the divided voltage and the reference voltage. The gain adjustment circuit G12 may adjust an output signal (first signal or second signal) of the comparator Cm12 to be equal to or greater than the first specified voltage. The output of the comparator Cm12 may be an input of the control circuit U12.

The control circuit U12 may adjust the duty cycle of the control signal depending on the output signal of the comparator Cm12. Since the output signal of the comparator Cm12 corresponds to the magnitude of the input voltage of the active power factor correction circuit P12, the control circuit U12 may adjust the duty cycle of the control signal depending on the magnitude of the input power of the active power factor correction circuit P12.

The second conversion device 130 may output a power that is down-scaled by converting a power digitally converted by the first conversion device 120. An amount of output current of the second conversion device 130 may be adjusted based on an amount of current consumed by the load circuit connected to the output terminal of the second conversion device 130. The second conversion device 130 may be configured to isolate a primary side and a secondary side. For example, the second conversion device 130 may include a half bridge LLC resonant converter or a flyback converter, which includes at least one transformer.

An output voltage of the second conversion device 130 may be transferred to the load circuit (not shown). The load circuit may include, for example, an LED driving circuit and an initialization circuit. The LED driving circuit may include, for example, a circuit for driving (e.g., lighting) an LED. The initialization circuit may include, for example, a circuit capable of receiving (or sensing) an LED lighting instruction (e.g., a control signal of a remote controller). For example, the second conversion device 130 may output at least one of a first driving voltage Vi supplied to the LED driving circuit and a second driving voltage Vdr supplied to the initialization circuit. For another example, the second conversion device 130 may always output the first driving voltage Vi and may output the second driving voltage Vdr at a time when the LED lighting instruction is received.

According to the above-described embodiment, since the first conversion device 120 adjusts the duty cycle of the switching element Q12 depending on the input voltage, thereby adjusting the output voltage to a certain range, when the input voltage changes rapidly, the output voltage may also change rapidly, and it may take some time to output the output voltage corresponding to the input voltage.

Figure 2:
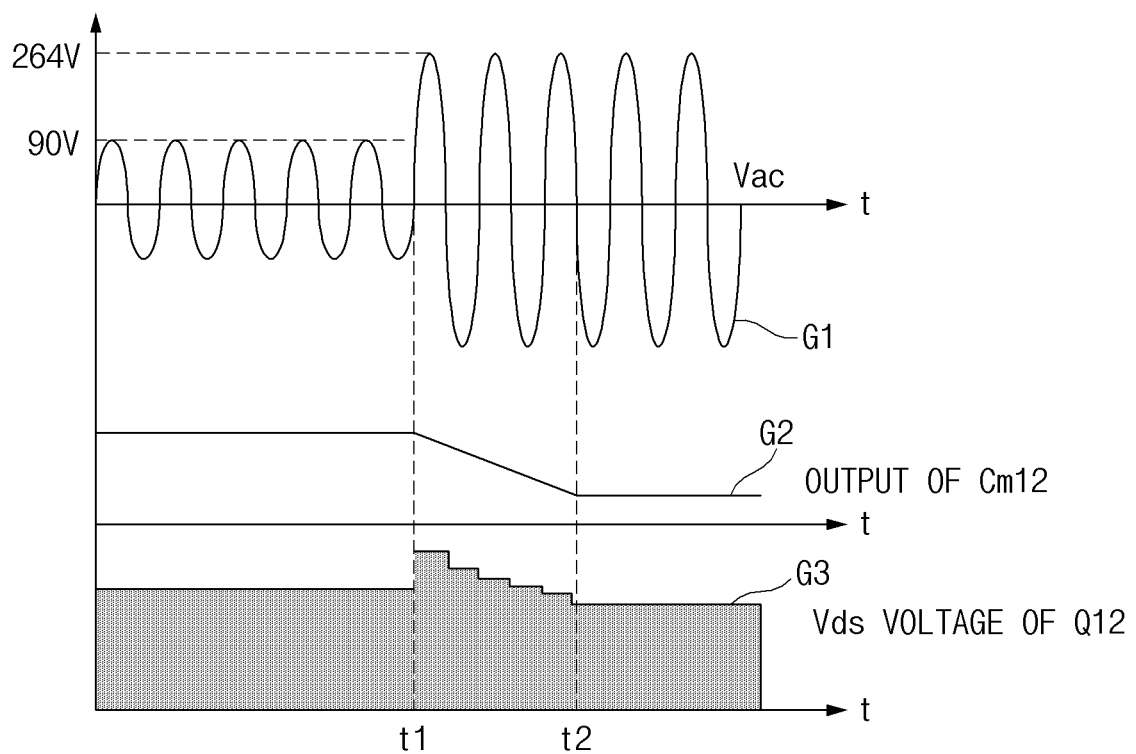
FIG. 2 illustrates a graph of each signal of the first conversion device (e.g., 120 of FIG. 1) according to an embodiment.

FIG. 2 illustrates a graph of each signal of the first conversion device (e.g., 120 of FIG. 1) according to an embodiment. In FIG. 2, a first graph G1 may represent the magnitude of the input voltage of the rectifying device (e.g., 120 of FIG. 1), a second graph G2 may represent the magnitude of the output signal of the comparator (e.g., Cm12 of FIG. 1), and a third graph G3 may represent a magnitude of a voltage Vds between the drain and the source of the switching element (e.g., Q12 of FIG. 1). The third graph G3 shows a voltage change that is rapidly switched due to the duty cycle of the control signal.

Referring to FIG. 2, at a time t1, the input voltage may rapidly change to 90V to 264V due to a cause such as power imbalance. Since the comparator Cm12 has a slow response characteristic, the comparator Cm12 may output a voltage corresponding to the 264V voltage only at a time t2 that is elapsed by a specified time t241 from the time t1.

Since the control circuit U12 identifies a change in the input voltage through the comparator Cm12, the control circuit U12 from the time t1 to the time t2 does not output the control signal corresponding to the changed input voltage 264V. Therefore, the active power factor correction circuit P12 may output a voltage exceeding a specified voltage range from the time t1 to the time t2. In this case, the condenser C12 connected to the output of the first conversion device 120 may be stressed from the time t1 to the time t2, so the condenser C12 having a relatively large capacity may be required at the output of the first conversion device 120. Because the electrolytic condenser is used as the condenser having the large capacity (e.g., 22 uF or more), the first conversion device 120 has an explosion risk due to the electrolytic condenser C12.

Figure 3:
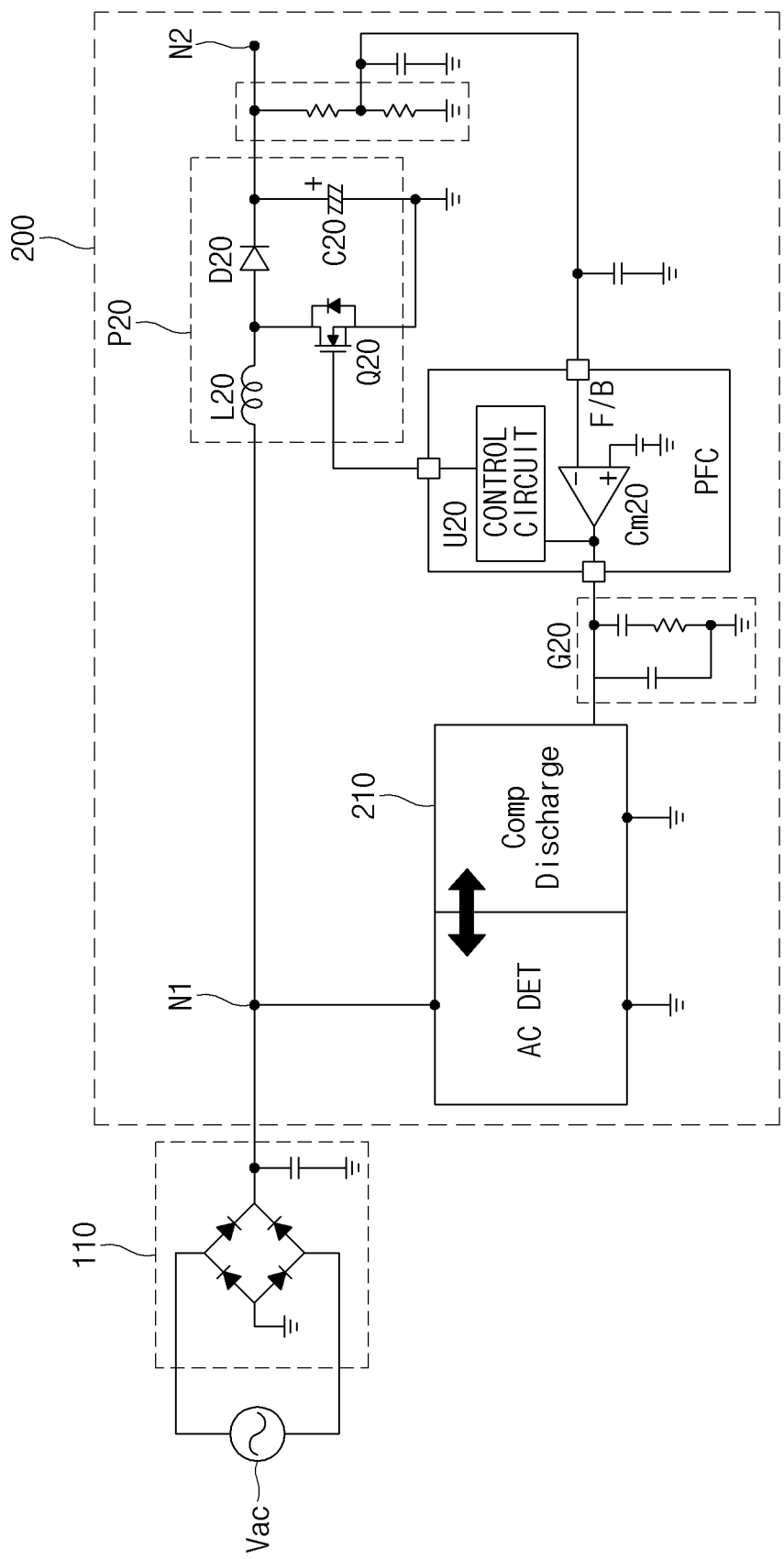
FIG. 3 illustrates a circuit of a power conversion device (e.g., 120 of FIG. 1) according to an embodiment.

FIG. 3 illustrates a circuit of a power conversion device (e.g., 120 of FIG. 1) according to an embodiment.

Referring to FIG. 3, according to an embodiment, a power conversion device 200 includes an input terminal N1, an active power factor correction circuit P20, an output terminal N2, a comparator Cm20, a control circuit U20, and a discharge circuit 210. In an embodiment, the power conversion device 200 may omit some components or further include additional components. In one embodiment, some of the components of the power conversion device 200 are combined to be configured as one entity, and the functions of the corresponding components before combining may be performed identically.

The input terminal N1 may receive the rectified AC power. The input terminal N1 may be a node (e.g., a pattern on an integrated circuit or a printed circuit board) or a pin of the integrated circuit formed such that the rectified AC power is input to the active power factor correction circuit P20.

The active power factor correction circuit P20 may be electrically connected between the input terminal N1 and the output terminal N2, and may output power factor-corrected power belonging to the specified voltage range (e.g., 390V≤395V≤400V) by correcting and boosting the power factor of the input power through the input terminal N1. The active power factor correction circuit P20 may include a switching element Q20 that is switched in response to the control signal and boosts the input power to correspond to the turn-on time. For example, the switching element Q20 may boost the input voltage to correspond to the duty cycle of the control signal. Since the detailed configuration of the active power factor correction circuit P20 is described with reference to FIG. 1, detailed description thereof will be omitted.

The output terminal N2 may be connected to the output of the active power factor correction circuit P20, an input of a dividing circuit B20, and an input of the second conversion device (e.g., 130 of FIG. 1).

The dividing circuit B20 may be connected to the output of the active power factor correction circuit P20, and may divide the output voltage of the active power factor correction circuit P20, for example, as a ratio of two resistance values connected in series. The divided voltage may fall within the input voltage range of the comparator Cm20. The input voltage range may be a voltage range detectable by the comparator Cm12.

The comparator Cm20 may compare the output voltage of the output terminal N2 with the reference voltage, and may output a signal having a different magnitude, based on the comparison result. For example, the comparator Cm20 may output the first signal when the output voltage of the output terminal N2 is less than the reference voltage, and may output the second signal (<first signal) when the output voltage of the output terminal N2 is greater than or equal to the reference voltage. For another example, the comparator Cm20 may output the difference voltage between the output voltage of the output terminal N2 and the reference voltage. A gain adjustment circuit G20 may be further connected to the output of the comparator Cm20, and may adjust the output signal of the comparator Cm20 such that the output of the comparator Cm20 is to be at least a specified magnitude or more.

The control circuit U20 may output the control signal corresponding to the output signal of the comparator Cm20. For example, the control circuit U20 may output the control signal having a duty cycle corresponding to the output signal of the comparator Cm20 by adjusting the duty cycle of the control signal depending on a level of the output signal of the comparator Cm20. The duty cycle of the control signal may be related to a boosting ratio of the active power factor correction circuit P20.

The discharge circuit 210 may be electrically connected between the input terminal N1 and the output of the comparator Cm20, and when the input voltage through the input terminal N1 is equal to or greater than the specified voltage, may discharge the output of the comparator Cm20 for the specified period. According to the above-described embodiment, as the discharge circuit 210 discharges the output of the comparator Cm20, the control circuit U20 may support to rapidly adjust the duty cycle of the control signal in response to the sudden increase in an input voltage Vin. Therefore, when the input voltage Vin suddenly increases due to the slow response characteristic of the comparator Cm20, as it takes some time to control the duty cycle of the switching element Q20, the discharge circuit 210 may improve a problem that an output voltage Vout exceeds the specified voltage range.

According to various embodiments, the power conversion device 200 may be included in the AC-DC conversion device (e.g., 100 of FIG. 1) to replace the first conversion device (e.g., 120 of FIG. 1).

Figure 4:
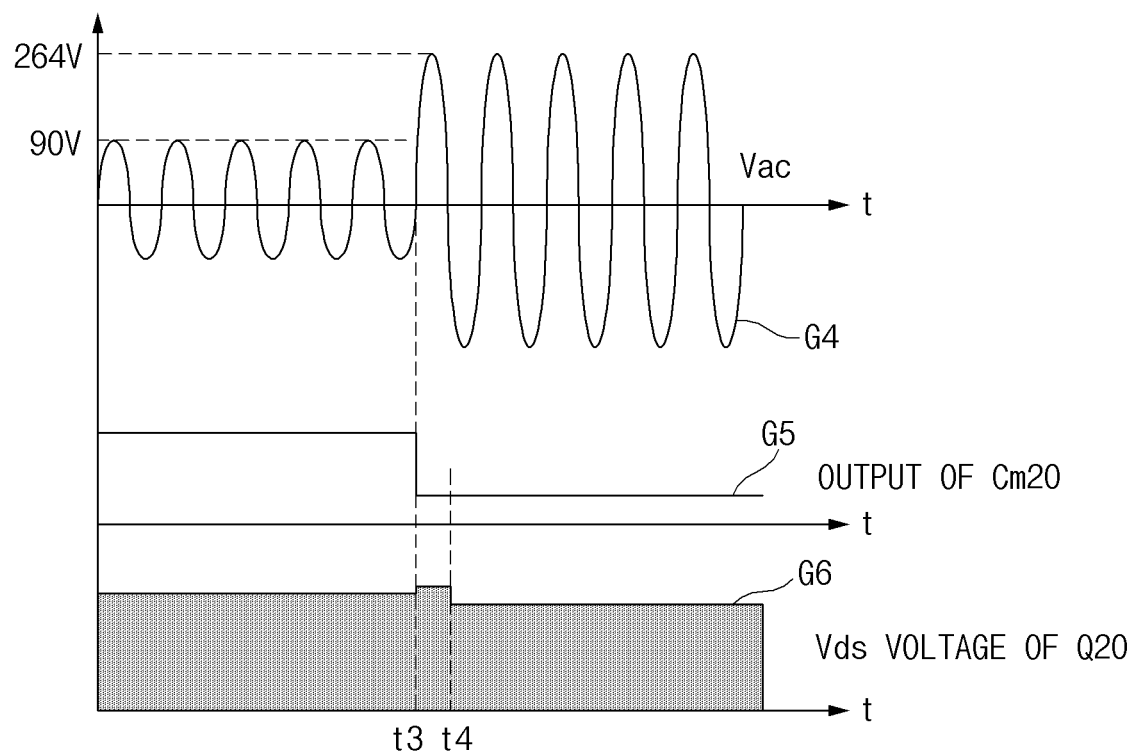
FIG. 4 illustrates a graph of each signal of a power conversion device (e.g., 210 of FIG. 2) according to an embodiment.

FIG. 4 illustrates a graph of each signal of a power conversion device (e.g., 210 of FIG. 2) according to an embodiment. In FIG. 4, a fourth graph G4 may represent a magnitude of the input voltage of the rectifying device (e.g., 120 of FIG. 1), a fifth graph G5 may represent a magnitude of the output signal of the comparator (e.g., Cm20 of FIG. 3), and a sixth graph G6 may represent a magnitude of the voltage Vds between the drain and the source of the switching element (e.g., Q20 of FIG. 3). The sixth graph G6 illustrates a voltage change that is switched at a high speed due to the duty cycle of the control signal.

Referring to FIG. 4, when the input voltage rapidly changes from 90V to 264V due to a cause such as power imbalance, as at a time t3, as the output of the comparator Cm20 is discharged by the discharge circuit 210, the comparator Cm20 may directly output a voltage corresponding to 264V. Accordingly, the active power factor correction circuit P20 may output a voltage exceeding the specified range only for a period (t4-t3) required for the control circuit U20 to react to the control signal that corresponds to a change in the output of the comparator Cm20. Therefore, the condenser C20 connected to the output of the power conversion device 200 may be less stressed than the condenser C12 connected to the output of the first conversion device 120. According to the above-described embodiment, the power conversion device 200 may reduce a capacity of the output condenser C20. For example, the power conversion device 200 may reduce the capacity of the output condenser C20 by more than half compared to the first conversion device 120.

Figure 5:
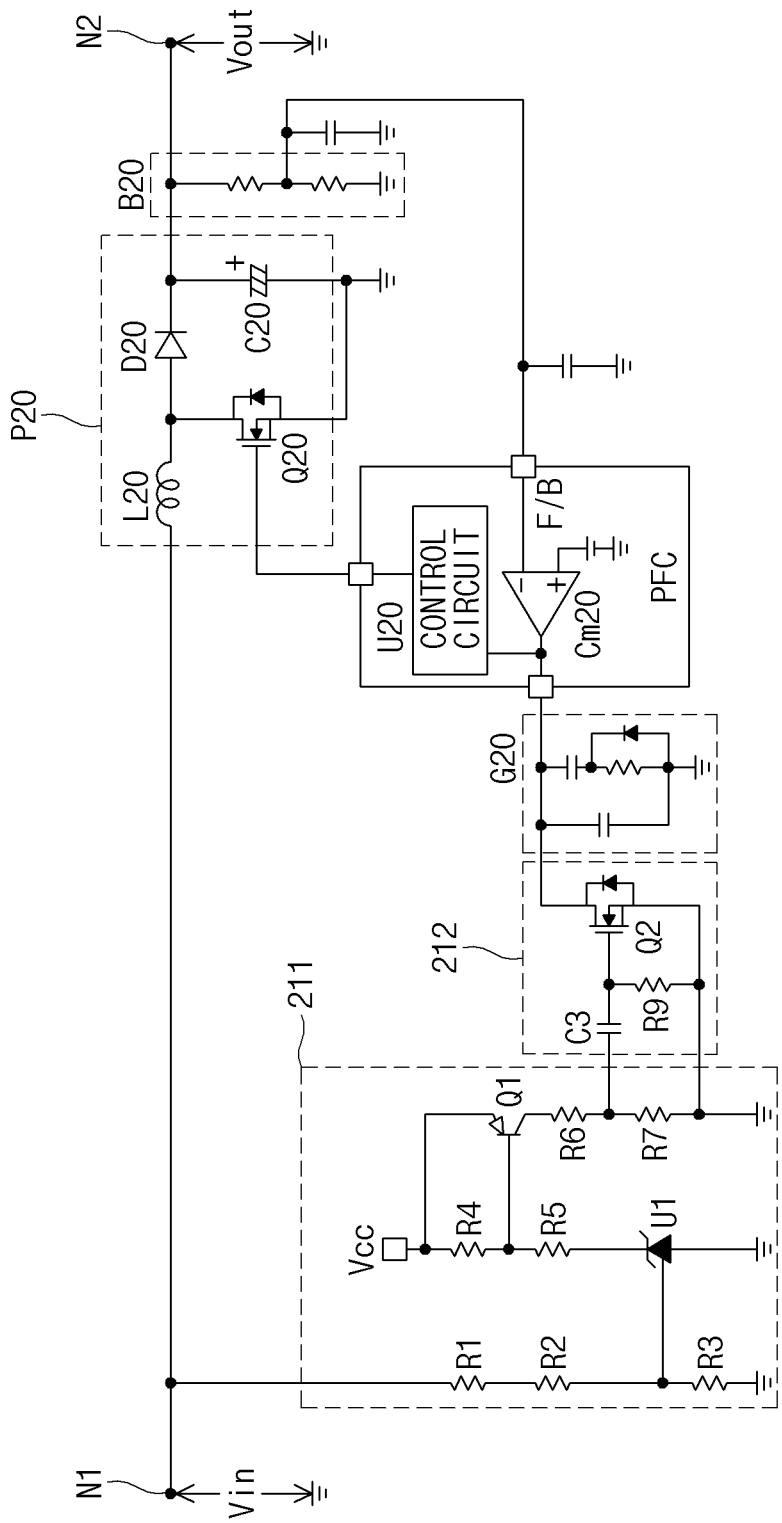
FIG. 5 illustrates a detailed configuration of a discharge circuit according to an embodiment.

FIG. 5 illustrates a detailed configuration of a discharge circuit according to an embodiment.

Referring to FIG. 5, according to an embodiment, the discharge circuit 210 may include a detection block 211 and a discharge block 212. In an embodiment, the discharge circuit 210 may omit some components or further include additional components. In an embodiment, some of the components of the discharge circuit 210 are combined to be configured as one entity, and the functions of the corresponding components before combining may be performed in the same way.

The detection block 211 may include a first resistor R1, a second resistor R2, a third resistor R3, a fourth resistor R4, a fifth resistor R5, a sixth resistor R6, a seventh resistor R7, a constant voltage circuit U1, and a first transistor Q1. The detection block 211 may output 0 voltage when the input voltage through the input terminal N1 is less than a specified voltage, and may output 0.7V or more voltage (third dividing voltage) when the input voltage is greater than or equal to the specified voltage.

The first resistor R1, the second resistor R2, and the third resistor R3 are connected in series between the input terminal N1 and the ground, and may divide the input power through the input terminal N1. For example, a first terminal of the first resistor R1 may be electrically connected to the input terminal N1, a second terminal of the first resistor R1 may be electrically connected to a first terminal of the second resistor R2, a second terminal of the second resistor R2 may be electrically connected to a first terminal of the third resistor R3, and a second terminal of the third resistor R3 may be electrically connected to the ground. The input power may be divided into a summed resistance value of the first resistor R1 and the second resistor R2 and a resistance value of the third resistor R3, and the divided voltage (hereinafter referred to as 'first divided voltage') may be applied to a first terminal of the constant voltage circuit U1. A resistance value of each of the first resistor R1, the second resistor R2, and the third resistor R3 may be set such that the first divided voltage is less than the reference voltage (e.g., 2.5V) of the constant voltage circuit U1 when a voltage (hereinafter referred to as 'input voltage') of the input power is less than a specified voltage (e.g., 140V), and may be set such that the first divided voltage is greater than or equal to the reference voltage of the constant voltage circuit U1 when the input voltage is greater than or equal to the specified voltage. The resistance value of each of the first resistor R1, the second resistor R2, and the third resistor R3 may be set to a size that does not damage the first terminal of the constant voltage circuit U1 in a range of current (hereinafter referred to as 'input current') of the input power.

A first terminal of the fourth resistor R4 may be electrically connected to an emitter of the transistor Q1 and a third driving voltage Vcc, and a second terminal of the fourth resistor R4 may be electrically connected to a base of the transistor Q1 and a first terminal of the fifth resistor R5. The third driving voltage may be a primary voltage of the second conversion device (e.g., 130 of FIG. 1) corresponding to the first driving voltage.

The first terminal of the fifth resistor R5 may be electrically connected to the second terminal of the fourth resistor R4 and the base of the transistor Q1, and the second terminal of the fifth resistor R5 may be electrically connected to a second terminal of the constant voltage circuit U1.

A first terminal of the sixth resistor R6 may be electrically connected to a collector of the transistor Q1, and a second terminal of the sixth resistor R6 may be electrically connected to the seventh resistor R7. A first terminal of the seventh resistor R7 may be electrically connected to the second terminal of the sixth resistor R6, and a second terminal of the seventh resistor R7 may be electrically connected to the ground.

The first terminal (e.g., control terminal) of the constant voltage circuit U1 may be electrically connected between the second resistor R2 and the third resistor R3, the second terminal of the constant voltage circuit U1 (e.g., input terminal) may be connected to the base of the transistor Q1 through the second terminal of the fifth resistor R5, and the third terminal (e.g., output terminal) of the constant voltage circuit U1 may be connected to the ground. The first divided voltage may be applied to the first terminal of the constant voltage circuit U1. When a voltage (first divided voltage) applied to the first terminal of the constant voltage circuit U1 is less than the reference voltage of the constant voltage circuit U1, the second terminal of the constant voltage circuit U1 and the third terminal of the constant voltage circuit U1 may be opened. When the first divided voltage is equal to or greater than the reference voltage of the constant voltage circuit U1, the second and third terminals of the constant voltage circuit U1 may be electrically shorted. When explaining in relation to the input voltage, when the input voltage is less than the specified voltage, the second terminal of the constant voltage circuit U1 and the third terminal of the constant voltage circuit U1 may be opened. When the input voltage is equal to or greater than the specified voltage, the second terminal of the constant voltage circuit U1 and the third terminal of the constant voltage circuit U1 may be electrically shorted. The constant voltage circuit U1 may be, for example, "TL 431".

The base of the transistor Q1 may be connected to the third driving voltage Vcc through the fourth resistor R4, the emitter of the transistor Q1 may be connected to the third driving voltage, and the collector of the transistor Q1 may be connected to the ground through the sixth resistor R6 and the seventh resistor R7. The transistor Q1 may be turned off when the second and third terminals of the constant voltage circuit U1 are opened. When the first and second terminals of the constant voltage circuit U1 are shorted, the transistor Q1 may be turned on due to a voltage (hereinafter referred to as a 'second divided voltage') divided by the fourth resistor R4 and the fifth resistor R5. When the transistor Q1 is turned on, a voltage (hereinafter referred to as a 'third divided voltage') that is divided based on a ratio between the resistance values of the sixth resistor R6 and the seventh resistor R7 may be applied to both terminals of the seventh resistor R7. The resistance value of each of the sixth resistor R6 and the seventh resistor R7, for example, may be set to turn on an FET Q2 during charging of a condenser C3.

The discharge block 212 may include the condenser C3, a ninth resistor R9, and the FET Q2. For example, when the discharge block 212 is supplied with a zero voltage (e.g., a voltage less than 0.7V) from the detection block 211, the discharge block 212 may not discharge the output of the comparator Cm20. When the discharge block 212 receives the third divided voltage (e.g., voltage of 0.7 V or more) from the detection block 211 through the condenser C3, the discharge block 212 may discharge the output of the comparator Cm20.

A first terminal of the condenser C3 may be electrically connected between the second terminal of the sixth resistor R6 and the first terminal of the seventh resistor R7, and a second terminal of the condenser C3 may be electrically connected to a first terminal of the ninth resistor R9 and the FET Q2. The condenser C3 may be charged when the transistor Q1 is turned on, and may be maintained in a charged state until the transistor Q1 is turned off. For example, the second terminal of the condenser C3 may output a first voltage during initial charging, and when charging is completed, may be maintained in a 0V state. A capacity of the condenser C3 may be set to correspond to a time required for a discharge of the comparator Cm20. For example, the capacity of the condenser C3 may be set such that a voltage passing through the condenser C3 is equal to or greater than a threshold voltage of the FET Q2 (e.g., 0.7V) during the specified period from a time when the transistor Q1 is turned on. For another example, the capacity of the condenser C3 may be set to couple the DC after the specified period from the time the transistor Q1 is turned on.

The ninth resistor R9 may be connected between a gate and the ground of the FET Q2.

The FET Q2 does not discharge the output of the comparator Cm20 when turned off, and may discharge the output of the comparator Cm20 when turned on.

According to the above-described embodiment, when the input voltage through the input terminal N1 is less than the specified voltage (e.g., 140V), the output (the voltage between the both terminals of the seventh resistor R7) of the detection block 211 may be 0V. For example, when the input voltage is less than the specified voltage, since a voltage below the reference voltage of the constant voltage circuit U1 is applied to the first terminal of the constant voltage circuit U1, the second and third terminals of the constant voltage circuit U1 may be opened. In this case, since the transistor Q1 is turned off, the voltage between the both terminals of the seventh resistor R7 may be 0V (or less than 0.7V). When the voltage between both terminals of the seventh resistor R7 is 0V (or less than 0.7 V), the FET Q2 is turned off, so that the output of the comparator Cm20 may not be discharged.

When the input voltage through the input terminal N1 is equal to or greater than the specified voltage, the voltage between both terminals of the seventh resistor R7 may charge the condenser C3. For example, the condenser C3 may output a voltage of 0.7V or more during the specified period being charging the voltage between both terminals of the seventh resistor R7. In this case, since the voltage of 0.7V is applied to the gate of the FET Q2 for the specified period, the FET Q2 may be turned on and the output of the comparator Cm20 may be discharged. For another example, when charging is completed through the voltage between both terminals of the seventh resistor R7, the condenser C3 may output 0V by coupling the DC. In this case, as a voltage of less than 0.7 V is applied to the FET Q2, the FET Q2 is turned off, and the output of the comparator Cm20 may no longer be discharged. The capacity of the condenser C3 may be set to correspond to the specified period.

According to the above-described embodiment, the discharge circuit 210 may discharge the output of the comparator Cm20 for the specified period during which the magnitude of the input voltage through the input terminal N1 is greater than or equal to the specified voltage, and a problem that the output condenser C3 of the power conversion device 200 is stressed by the high voltage due to the slow response characteristic of the comparator Cm20 may be improved.

Figure 6:
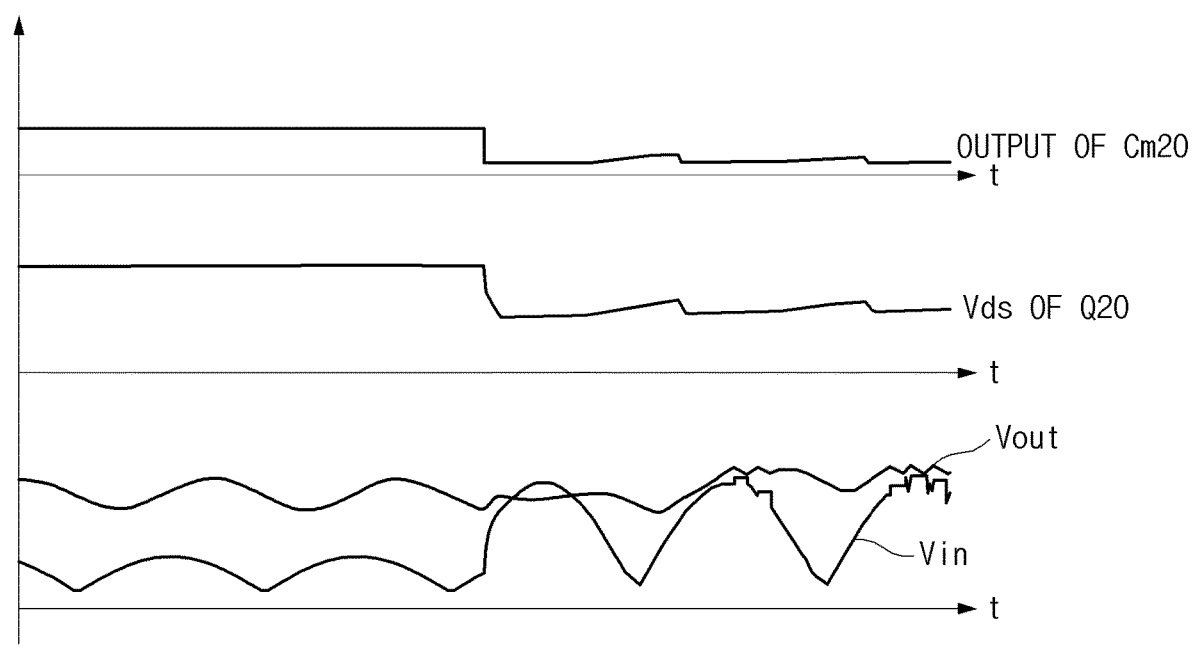
FIG. 6 illustrates a graph of each signal of the power conversion device according to an embodiment.

FIG. 6 illustrates a graph of each signal of the power conversion device according to an embodiment.

Referring to FIG. 6, according to one embodiment, when the discharge circuit 210 detects that the input voltage Vin is increased from below the specified voltage to above the specified voltage, the discharge circuit 210 may discharge the output of the comparator Cm20 for the specified time. The control circuit U20 may identify the change in the input voltage Vin at a time when the input voltage Vin equal to or greater than the specified voltage is applied, and may decrease the duty cycle of the control signal. Therefore, the turn-on time of the switching element Q20 and the boosting ratio of the active power factor correction circuit P20 may be controlled to correspond to the change in the input voltage Vin. Accordingly, the stress of the output terminal N2 due to a time required for a feedback of the input voltage Vin of the discharge circuit 210 may be improved.

Figure 7:
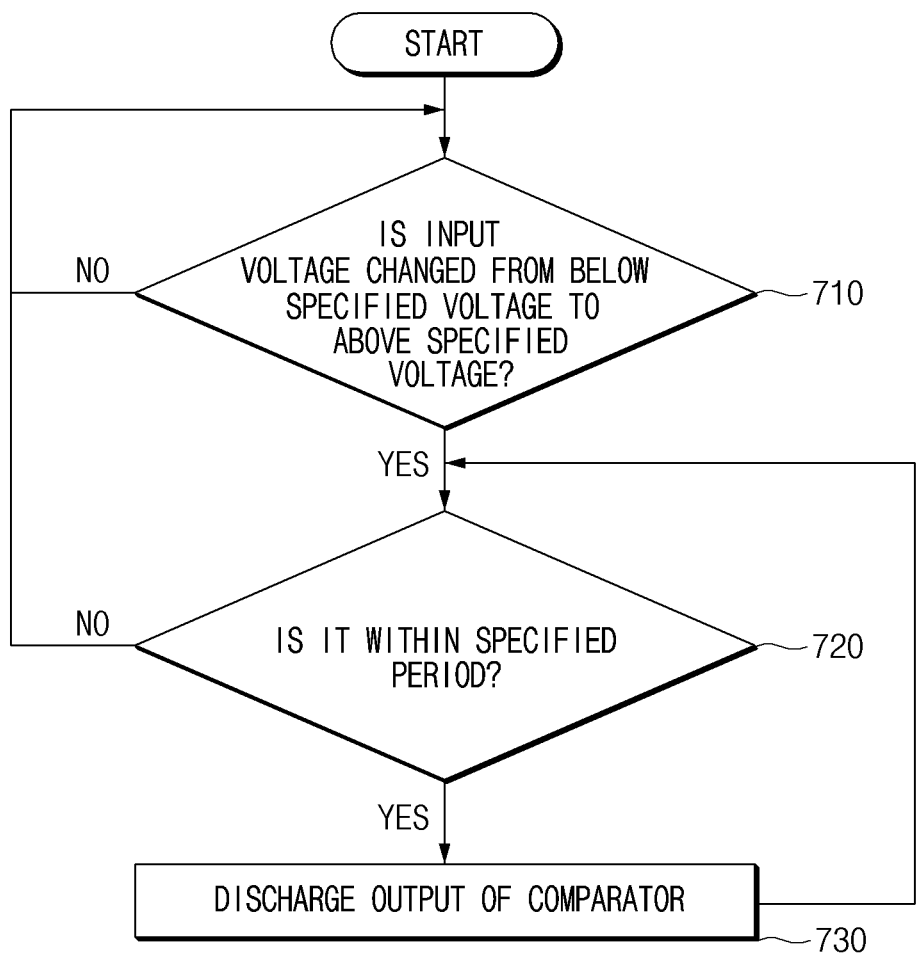
FIG. 7 illustrates a flowchart of a power conversion method according to an embodiment.

FIG. 7 illustrates a flowchart of a power conversion method according to an embodiment.

Referring to FIG. 7, in operation 710, the discharge circuit 210 may monitor whether the input voltage changes from below the specified voltage to above the specified voltage. For example, when the input voltage is less than the specified voltage, the divided voltage of the input voltage that is applied to the first terminal of the constant voltage circuit U1 may be less than the reference voltage of the constant voltage circuit U1. Then, the second and third terminals of the constant voltage circuit U1 are opened, since the voltage difference between the base and the emitter of the transistor Q1 is less than 0.7V, the transistor Q1 may be turned off. In this case, the FET Q2 is turned off, and the FET Q2 may not discharge the output of comparator Cm20.

In operation 720, the discharge circuit 210 may determine whether it is within the specified period when the input voltage is changed from below the specified voltage to above the specified voltage.

In operation 730, when the input voltage changes within the specified period, the discharge circuit 210 may discharge the output of the comparator Cm20. For example, when the input voltage is greater than or equal to the specified voltage, the divided voltage of the input voltage that is applied to the first terminal of the constant voltage circuit U1 may be greater than or equal to the reference voltage of the constant voltage circuit U1. In this case, as the second and third terminals of the constant voltage circuit U1 are shorted, the voltage difference between the base and the emitter of the transistor Q1 is 0.7V or more, so that the transistor Q1 may be turned on. When the transistor Q1 is turned on, the condenser C3 is charged, the FET Q2 is turned on while the condenser C3 is charged, and the FET Q2 may discharge the output of the comparator Cm20.

In operation 720, when the specified period elapses, the discharge circuit 210 may return to operation 710 without further discharging the output of the comparator Cm20. The operations 710 to 730 may be repeated whenever the input voltage changes from below the specified voltage to above the specified voltage.

According to an embodiment, a power conversion device (200 of FIG. 3) includes an input terminal (e.g., N1 of FIG. 3) that receives a rectified AC power, an active power factor correction circuit (e.g., P20 of FIG. 3) that boosts an input power through the input terminal and corrects a power factor, the active power factor correction circuit including a switching element (e.g., Q20 of FIG. 3) that turns on or off in response to a control signal and boosts an input voltage among the input power to correspond to a turn on time, an output terminal (e.g., N2 of FIG. 3) connected to an output of the active power factor correction circuit, a comparator (e.g., Cm20 of FIG. 3) that compares an output voltage of the output terminal with a reference voltage and outputs a signal having a different magnitude depending on the comparison result, a control circuit (e.g., U20 of FIG. 3) that adjusts a duty cycle of the control signal depending on an output signal of the comparator, and a discharge circuit (e.g., 210 of FIG. 3) electrically connected between the input terminal and an output of the comparator, and when the input voltage is equal to or greater than a first specified voltage, that discharges the output of the comparator.

The discharge circuit may be provided to discharge the output of the comparator for a specified period.

The discharge circuit may include a first switching element (e.g., Q1 of FIG. 3) that is turned on when the input voltage is equal to or greater than the first specified voltage, and a second switching element (e.g., Q2 of FIG. 3) connected between an output of the first switching element and the output of the comparator, and when turned on, that allows the output of the comparator to be discharged to a ground.

The discharge circuit may further include a condenser (e.g., C3 of FIG. 5) of which a first terminal is electrically connected to an output of the first switching element and a second terminal is electrically connected to a control terminal of the second switching element, and a resistor (e.g., R9 of FIG. 5) of which a first terminal is electrically connected to the control terminal of the second switching element and a second terminal is electrically connected to the ground, wherein a voltage equal to or greater than a second specified voltage passing through the condenser is applied to the control terminal of the second switching element while a specified period from a time when the first switching element is turned on, and wherein the second switching element is provided to be turned on while the voltage equal to or greater than the second specified voltage is applied to the control terminal.

The second switching element may be an FET, wherein a gate of the FET may be connected to the second terminal of the condenser, wherein a drain of the FET may be connected to the output of the comparator, wherein a source of the FET may be connected to the ground, and wherein, when the voltage equal to or greater than the second specified voltage is applied to the gate of the FET, the FET may be provided to be turned on.

A capacitance of the condenser may be set to couple a direct current after the specified period from a time when the first switching element is turned off.

When the input voltage is less than the first specified voltage, the first switching element may be provided to be turned off, and wherein, when the first switching element is turned off, the second switching element may be provided to be turned off.

The power conversion device may further include a constant voltage circuit (e.g., U1 of FIG. 5) of which a first terminal receives a conversion voltage of the input voltage, a second terminal is connected to the first switching element, and a third terminal is connected to the ground, wherein the first switching element may be an NPN transistor, wherein an emitter of the NPN transistor may be connected to a driving voltage, wherein a base of the NPN transistor may receive the driving voltage through a first resistor (R4), wherein a collector of the NPN transistor may be connected to the ground through a second resistor (R6, and R7), wherein, when the conversion voltage of the input voltage is equal to or greater than a reference voltage of the constant voltage circuit, the second terminal of the constant voltage circuit and the third terminal of the constant voltage circuit may be shorted, and wherein, when the second terminal of the constant voltage circuit and the third terminal of the constant voltage circuit are shorted, the NPN transistor may be provided to be turned on.

The power conversion device may further include a dividing circuit (e.g., R1, R2, and R3 of FIG. 5) that divides the input voltage to fall within a range detectable by the constant voltage circuit, wherein the first terminal of the constant voltage circuit may receive a voltage divided by the dividing circuit, and wherein, when the divided voltage is equal to or greater than the reference voltage of the constant voltage circuit, the second terminal of the constant voltage circuit and the third terminal of the constant voltage circuit may be provided to be shorted.

When the conversion voltage of the input voltage is less than the reference voltage of the constant voltage circuit, the second terminal of the constant voltage circuit and the third terminal of the constant voltage circuit are opened, and wherein, when the second terminal of the constant voltage circuit and the third terminal of the constant voltage circuit are opened, the NPN transistor may be provided to be turned off.

According to an embodiment, an AC-DC conversion device (e.g., 100 of FIG. 1) includes a rectifying device (e.g., 110 of FIG. 3) that rectifies an AC power, and a power conversion device (e.g., 200 of FIG. 3) that receives the rectified AC power and outputs a power as a result of power factor correction and boosting, wherein the power conversion device includes an input terminal (e.g., N1 of FIG. 3) that receives the rectified AC power, an active power factor correction circuit (e.g., P20 of FIG. 3) that boosts an input power through the input terminal and corrects a power factor, the active power factor correction circuit including a switching element (e.g., Q20 of FIG. 3) that turns on or off in response to a control signal and boosts an input voltage among the input power to correspond to a turn on time, an output terminal (e.g., N2 of FIG. 3) connected to an output of the active power factor correction circuit, a comparator (e.g., Cm20 of FIG. 3) that compares an output voltage of the output terminal with a reference voltage and outputs a signal having a different magnitude depending on the comparison result, a control circuit (e.g., U20 of FIG. 3) that adjusts a duty cycle of the control signal depending on an output signal of the comparator, a discharge circuit (e.g., 210 of FIG. 3) electrically connected between the input terminal and an output of the comparator, and when the input voltage is equal to or greater than a first specified voltage, that discharges the output of the comparator.

The AC-DC conversion device may further include a DC conversion circuit (e.g., 130 of FIG. 1) that down-converts an output of the power conversion device to correspond to a driving voltage magnitude of a load circuit.

The discharge circuit may be provided to discharge the output of the comparator for a specified period.

The discharge circuit may further include a condenser (e.g., C3 of FIG. 5) of which a first terminal electrically connected to an output of the first switching element and a second terminal electrically connected to a control terminal of the second switching element, and a resistor (e.g., R9 of FIG. 5) of which a first terminal is electrically connected to a control terminal of the second switching element and a second terminal is electrically connected to the ground, wherein a voltage equal to or greater than a second specified voltage passing through the condenser may be applied to the control terminal of the second switching element while a specified period from a time when the first switching element is turned on, and wherein the second switching element is provided to be turned on while the voltage equal to or greater than the second specified voltage may be applied to the control terminal.

The second switching element may be an FET, wherein a gate of the FET may be connected to the second terminal of the condenser, wherein a drain of the FET may be connected to the output of the comparator, wherein a source of the FET may be connected to the ground, and wherein, when the voltage equal to or greater than the second specified voltage is applied to the gate of the FET, the FET may be provided to be turned on.

A capacitance of the condenser may be set to couple a direct current after the specified period from a time when the first switching element is turned off.

When the input voltage is less than the first specified voltage, the first switching element may be provided to be turned off, and wherein, when the first switching element is turned off, the second switching element may be provided to be turned off.

At least a portion of an apparatus (e.g., modules or functions thereof) or a method (e.g., operations) according to various embodiments may be implemented as an instruction stored in a computer-readable storage medium in the form of a program module. When the instruction is executed by the processor, the processor may perform a function corresponding to the instruction. The computer-readable storage medium include hard disks, floppy disks, magnetic media (e.g. magnetic tape), optical recording media (e.g., CD-ROM, DVD, magnetic-optical media (e.g., floptical disk), internal memory, and the like. The instruction may include code generated by the compiler or code that may be executed by an interpreter. The module or program module according to various embodiments may include at least one or more of the above-described components, some of them may be omitted, or other components may be further included.

According to various embodiments, operations performed by the module, program module, or other component may be sequentially, parallelly, repeatedly, or heuristically executed, at least some operations may be executed in a different order, or omitted, or other operations may be added. In addition, the embodiments disclosed in the disclosure are provided for description and understanding of the disclosed technical content, and are not intended to limit the scope of the technologies described in the disclosure. Accordingly, the scope of the disclosure should be construed to include all changes or various other embodiments based on the technical spirit of the disclosure.

The invention claimed is:

1. A power conversion device comprising:
    an input terminal configured to receive a rectified AC power;
    an active power factor correction circuit configured to boost an input power through the input terminal and to correct a power factor, the active power factor correction circuit including a switching element that turns on or off in response to a control signal and boosts an input voltage among the input power to correspond to a turn on time;
    an output terminal connected to an output of the active power factor correction circuit;
    a comparator configured to compare an output voltage of the output terminal with a reference voltage and to output a signal having a different magnitude depending on the comparison result;
    a control circuit configured to adjust a duty cycle of the control signal depending on an output signal of the comparator; and
    a discharge circuit electrically connected between the input terminal and an output of the comparator, and when the input voltage is equal to or greater than a first specified voltage, configured to discharge the output of the comparator.

2. The power conversion device of claim 1, wherein the discharge circuit is provided to discharge the output of the comparator for a specified period.

3. The power conversion device of claim 1, wherein the discharge circuit includes:
    a first switching element configured to be turned on when the input voltage is equal to or greater than the first specified voltage; and
    a second switching element connected between an output of the first switching element and the output of the comparator, and when turned on, configured to allow the output of the comparator to be discharged to a ground.

4. The power conversion device of claim 3, further comprising:
    a condenser of which a first terminal electrically connected to an output of the first switching element and a second terminal electrically connected to a control terminal of the second switching element; and
    a resistor of which a first terminal is electrically connected to a control terminal of the second switching element and a second terminal is electrically connected to the ground,
    wherein a voltage equal to or greater than a second specified voltage passing through the condenser is applied to the control terminal of the second switching element while a specified period from a time when the first switching element is turned on, and
    wherein the second switching element is provided to be turned on while the voltage equal to or greater than the second specified voltage is applied to the control terminal.

5. The power conversion device of claim 4, wherein the second switching element is an FET,
    wherein a gate of the FET is connected to the second terminal of the condenser,
    wherein a drain of the FET is connected to the output of the comparator,
    wherein a source of the FET is connected to the ground, and
    wherein, when the voltage equal to or greater than the second specified voltage is applied to the gate of the FET, the FET is provided to be turned on.

6. The power conversion device of claim 4, wherein a capacitance of the condenser is set to couple a direct current after the specified period from a time when the first switching element is turned off.

7. The power conversion device of claim 3, wherein, when the input voltage is less than the first specified voltage, the first switching element is provided to be turned off, and
    wherein, when the first switching element is turned off, the second switching element is provided to be turned off.

8. The power conversion device of claim 3, wherein the discharge circuit further includes a constant voltage circuit of which a first terminal receives a conversion voltage of the input voltage, a second terminal is connected to the first switching element, and a third terminal is connected to the ground,
    wherein the first switching element is an NPN transistor,
    wherein an emitter of the NPN transistor is connected to a driving voltage, wherein a base of the NPN transistor receives the driving voltage through a first resistor, wherein a collector of the NPN transistor is connected to the ground through a second resistor, wherein, when the conversion voltage of the input voltage is equal to or greater than a reference voltage of the constant voltage circuit, the second terminal of the constant voltage circuit and the third terminal of the constant voltage circuit are shorted, and wherein, when the second terminal of the constant voltage circuit and the third terminal of the constant voltage circuit are shorted, the NPN transistor is provided to be turned on.

9. The power conversion device of claim 8, wherein the discharge circuit further includes a dividing circuit configured to divide the input voltage to fall within a range detectable by the constant voltage circuit, wherein the first terminal of the constant voltage circuit receives a voltage divided by the dividing circuit, and wherein, when the divided voltage is equal to or greater than the reference voltage of the constant voltage circuit, the second terminal of the constant voltage circuit and the third terminal of the constant voltage circuit are provided to be shorted.

10. The power conversion device of claim 8, wherein, when the conversion voltage of the input voltage is less than the reference voltage of the constant voltage circuit, the second terminal of the constant voltage circuit and the third terminal of the constant voltage circuit are opened, and wherein, when the second terminal of the constant voltage circuit and the third terminal of the constant voltage circuit are opened, the NPN transistor is provided to be turned off.

11. An AC-DC conversion device comprising:

a rectifying device configured to rectify an AC power; and a power conversion device configured to receive the rectified AC power and to output a power as a result of power factor correction and boosting, wherein the power conversion device comprises:

an input terminal configured to receive the rectified AC power;

an active power factor correction circuit configured to boost an input power through the input terminal and to correct a power factor, the active power factor correction circuit including a switching element that turns on or off in response to a control signal and boosts an input voltage among the input power to correspond to a turn on time;

an output terminal connected to an output of the active power factor correction circuit;

a comparator configured to compare an output voltage of the output terminal with a reference voltage and to output a signal having a different magnitude depending on the comparison result;

a control circuit configured to adjust a duty cycle of the control signal depending on an output signal of the comparator; and a discharge circuit electrically connected between the input terminal and an output of the comparator, and when the input voltage is equal to or greater than a first specified voltage, configured to discharge the output of the comparator.

12. The AC-DC conversion device of claim 11, further comprising:

a DC conversion circuit configured to down-convert an output of the power conversion device to correspond to a driving voltage magnitude of a load circuit.

13. The AC-DC conversion device of claim 11, wherein the discharge circuit is provided to discharge the output of the comparator for a specified period.

14. The AC-DC conversion device of claim 11, wherein the discharge circuit includes:

a first switching element configured to be turned on when the input voltage is equal to or greater than the first specified voltage; and a second switching element connected between an output of the first switching element and the output of the comparator, and when turned on, configured to allow the output of the comparator to be discharged to a ground.

15. The AC-DC conversion device of claim 14, further comprising:

a condenser of which a first terminal electrically connected to an output of the first switching element and a second terminal electrically connected to a control terminal of the second switching element; and a resistor of which a first terminal is electrically connected to a control terminal of the second switching element and a second terminal is electrically connected to the ground, wherein a voltage equal to or greater than a second specified voltage passing through the condenser is applied to the control terminal of the second switching element while a specified period from a time when the first switching element is turned on, and wherein the second switching element is provided to be turned on while the voltage equal to or greater than the second specified voltage is applied to the control terminal.

* * * * *